United States Patent
Singh et al.

(10) Patent No.: US 6,567,944 B1
(45) Date of Patent: May 20, 2003

(54) BOUNDARY SCAN CELL DESIGN FOR HIGH PERFORMANCE I/O CELLS

(75) Inventors: Gajendra P. Singh, Sunnyvale, CA (US); Jaya Prakash Samala, San Jose, CA (US); Sridhar Narayanan, Cupertino, CA (US); Ishwardutt Parulkar, San Francisco, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 163 days.

(21) Appl. No.: 09/616,826

(22) Filed: Jul. 14, 2000

Related U.S. Application Data

(60) Provisional application No. 60/199,672, filed on Apr. 25, 2000.

(51) Int. Cl.[7] .............................................. G01R 31/28
(52) U.S. Cl. ....................................................... 714/727
(58) Field of Search ................................. 714/727, 726, 714/731; 326/16

(56) References Cited

U.S. PATENT DOCUMENTS

| | | | | |
|---|---|---|---|---|
| 5,281,864 A | | 1/1994 | Hahn et al. ............... 307/272.2 |
| 5,450,415 A | * | 9/1995 | Kamada | |
| 5,490,151 A | * | 2/1996 | Feger et al. | |
| 5,615,217 A | * | 3/1997 | Horne et al. | |
| 5,631,911 A | | 5/1997 | Whetsel, Jr. ............... 371/22.3 |
| 5,644,580 A | | 7/1997 | Champlin ................... 371/22.5 |
| 5,701,307 A | | 12/1997 | Whetsel ....................... 371/22.3 |
| 5,805,197 A | | 9/1998 | Fleming et al. ............. 347/237 |
| 5,809,036 A | | 9/1998 | Champlin ................ 371/22.31 |
| 5,831,866 A | | 11/1998 | Burgun et al. ............... 364/488 |
| 6,108,807 A | | 8/2000 | Ke ............................... 714/726 |

* cited by examiner

*Primary Examiner*—Albert Decady
*Assistant Examiner*—Esaw Abraham
(74) *Attorney, Agent, or Firm*—Thelen Reid & Priest LLP; Marc S. Hanish

(57) ABSTRACT

A boundary scan cell design which places the multiplexor before the functional flip-flop on the functional line path, reducing the multiplexor delay in the critical path. This optimizes the multiplexor and functional flip-flop orientation, allowing for a significant reduction in the time required from output of the functional flip-flop to a pin or to the interior of the CPU (the clock to q delay). In order to ensure that boundary scan mode functions properly, the functional flip-flop may be designed to act as a buffer, i.e. become transparent, when the boundary scan cell is in boundary scan mode.

3 Claims, 5 Drawing Sheets

BOUNDARY SCAN CELL DESIGN FOR HIGH PERFORMANCE I/O CELLS

STATEMENT OF RELATED APPLICATION

This application claims priority based on provisional application serial No. 60/199,672, entitled "BOUNDARY SCAN CELL DESIGN FOR HIGH PERFORMANCE I/O CELLS" by Gajendra P. Singh, Jaya Prakash Samala, Sridhar Narayanan, and Ishwardutt Parulkar, filed on Apr. 25, 2000.

BACKGROUND OF THE INVENTION

1. Field of the Invention

The present invention relates to Very Large Scale Integration (VLSI) design. More specifically, the present invention relates to a boundary scan cell design for high performance input/output (I/O) cells.

2. The Background

Microprocessors generally comprise a central processing unit (CPU) on a chip. FIG. 1. is a block diagram illustrating a typical microprocessor. The core 2 of the chip contains most of the architectural functionality of the microprocessor. The input/output (I/O) logic 8 contains circuitry to interface the core 2 of the chip with the pins 12 of the chip. Lines 6 are connections from the core 2 to the I/O logic 8 and lines 10 are connections from the I/O logic 8 to the pins 12. Corresponding to each pin of the chip, there is an I/O cell from the I/O logic 8.

Boundary scan is a collection of design rules applied to integrated circuits that enables testing and debugging of the circuit at the circuit level, at the printed circuit board level, and at the module or system level. IEEE/ANSI Standard 1149.1 is the current industry-wide standard used for rules of boundary scan design.

One component of the boundary scan standard is the boundary scan data register. FIG. 2 is a schematic diagram illustrating an existing logic design of an output cell that implements one bit of a boundary scan data register. A boundary scan I/O cell 50 has two paths, a functional path and a test path used during boundary scan mode (boundary scan path). The functional path is used for data during the normal operation of the cell. The boundary scan path is used for data during the scan or test mode. Functional flip-flop 52 stores functional data during normal operation. One of ordinary skill in the art will recognize that there are many ways of designing the functional flip-flop within the requirements of the IEEE 1149.1 standard.

These cells are normally arranged all the way around the border of the CPU, hence the name "boundary scan cells".

Functional flip-flop 52 takes as input data 54, or d. The output of functional flip-flop 52 is a q line 56. Functional flip-flop 52 may also be designed to receive clock signal 58, which controls when data is read out of the storage.

The boundary scan path fans out from the q line 56 and contains two stages, a capture stage 60 and an update stage 62. Each stage contains a flip-flop. The capture stage is meant for capturing functional data from the q line 56 into the update stage 62. The capture stage of each of the I/O cells may be chained serially so that captured data can be shifted out serially from the whole boundary scan data register. A clock signal 64 indicates when data should be read out of the capture stage 60. Boundary scan input signal 66 may be output to the update stage 62 when a shift enable signal 68 is driven high, whereas the input from the q line 56 is output to the update stage 62 when the shift enable signal 68 is low. The update stage flip-flop 62 also has as input an update enable signal 70 which indicates whether or not to update. The output of the boundary scan path is fed to a multiplexor 72, where it is multiplexed with the functional path, with an boundary scan mode input 74 that indicates whether the functional path or the boundary scan path should be fed to the output of the cell 76.

Therefore, the functional path runs from functional flip-flop 52 through q line 56 to multiplexor 72, whereas the boundary scan path runs from functional flip-flop 52 through q line 56, through capture stage 60 and update stage 62, and finally to multiplexor 72.

This cell design may be used as either in input cell or an output cell. In the case of an input cell, the data 54 is tied to a pin at the edge of the chip, while the output of the multiplexor 76 is tied to the interior of the CPU. In an output cell, the data 54 is tied to the interior of the CPU while the output of the multiplexor 76 is tied to a pin at the edge of the chip.

Speed is of critical concern to chip manufacturers. Once the functional flip-flop 52 performs its functions, the speed at which the q output signal 56 reaches a pin (or the interior of the CPU in the case of an input cell) is extremely important. Unfortunately, the presence of multiplexor 72 in the functional path adds a delay which can prove costly. What is needed is a boundary scan cell design which does not suffer this multiplexor delay in a critical path.

SUMMARY OF THE INVENTION

A boundary scan cell design which places the multiplexor before the functional flip-flop on the functional path, reducing the multiplexor delay in the critical path. The re-positioning of the multiplexor is taken advantage of to design an optimal multiplexor and flip-flop combination, allowing for a significant reduction in the time required from the output of the functional flip-flop to a pin or the core of the chip (the clock to q delay). In order to ensure that boundary scan mode functions properly, the functional flip-flop may be designed to act as a buffer, i.e. become transparent, when the boundary scan cell is in boundary scan mode.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons after review of this disclosure.

Figure 1:
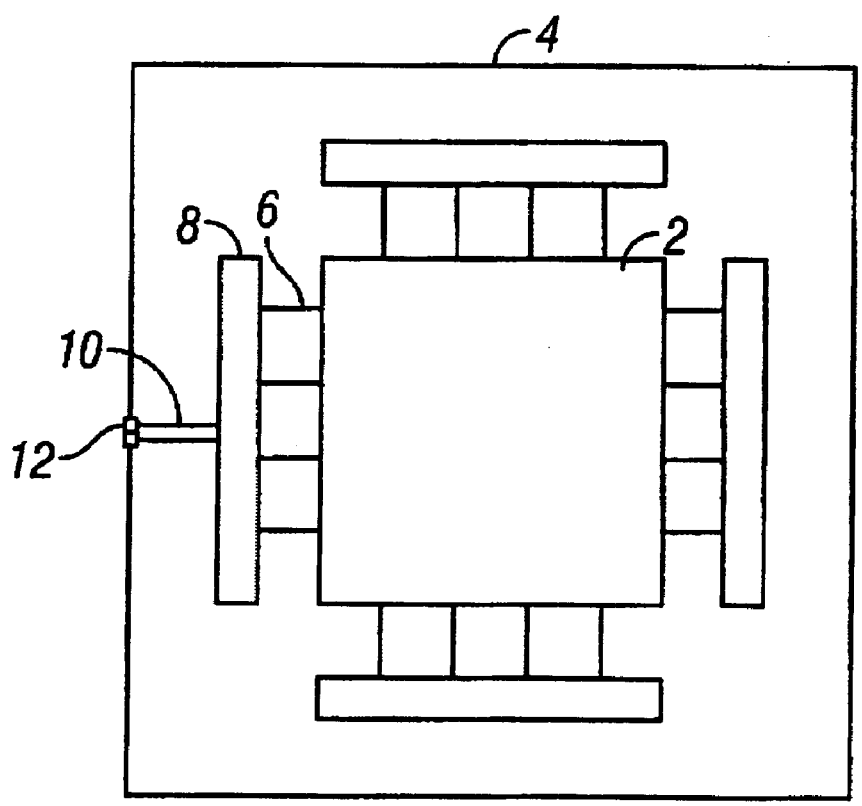
FIG. 1 is a block diagram illustrating a typical microprocessor.
Figure 2:
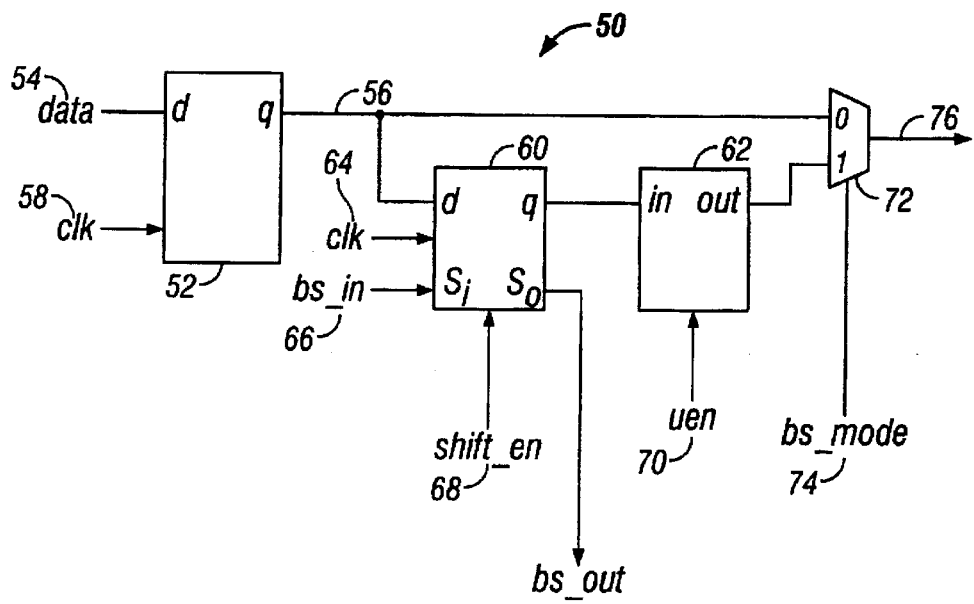
FIG. 2 is a schematic diagram illustrating an existing logic design of an output cell that implements one bit of a boundary scan data register.
Figure 3:
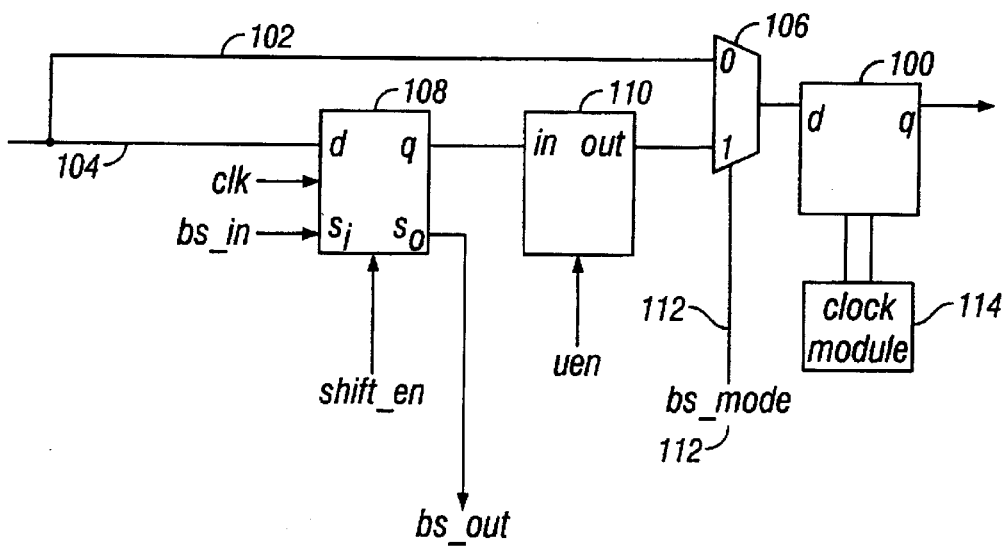
FIG. 3 is a schematic diagram illustrating a boundary scan cell design in accordance with a presently preferred embodiment of the present invention.

FIG. 3 is a schematic diagram illustrating a boundary scan cell design in accordance with a presently preferred embodiment of the present invention. This implementation allows the multiplexor to be placed before the functional flip-flop, dramatically reducing the delay after the functional flip-flop has performed its functions.

Functional flip-flop 100 is placed at the output side of the boundary scan cell. The functional path 102 is multiplexed at multiplexor 106 with the output of the boundary scan path (line 104 to capture stage 108 to update stage 110). Functional flip-flop 100 is designed to function as a flip-flop when in functional mode, and as a buffer (i.e. transparent) when in boundary scan mode.

While there is a multiplexor delay in the functional path, it occurs before the functional flip-flop 100 executes its functions and thus is not costly in terms of performance because there is no multiplexor delay from the output of the functional flip-flop to the pin or interior of the cell (q to pin delay).

In boundary scan mode, a boundary scan mode signal 112 to the input of multiplexor 106 indicates that the boundary scan path is selected. Thus, boundary scan circuitry may perform its capture stage and update stage functions and the output passed to functional flip-flop 100. Since this is boundary scan mode, the functional flip-flop works as a buffer and passes data to the output of the cell. A clock module 114 may control the functional flip-flop 100 as to whether it should act as a flip-flop or as a buffer depending on the mode.

Figure 4:
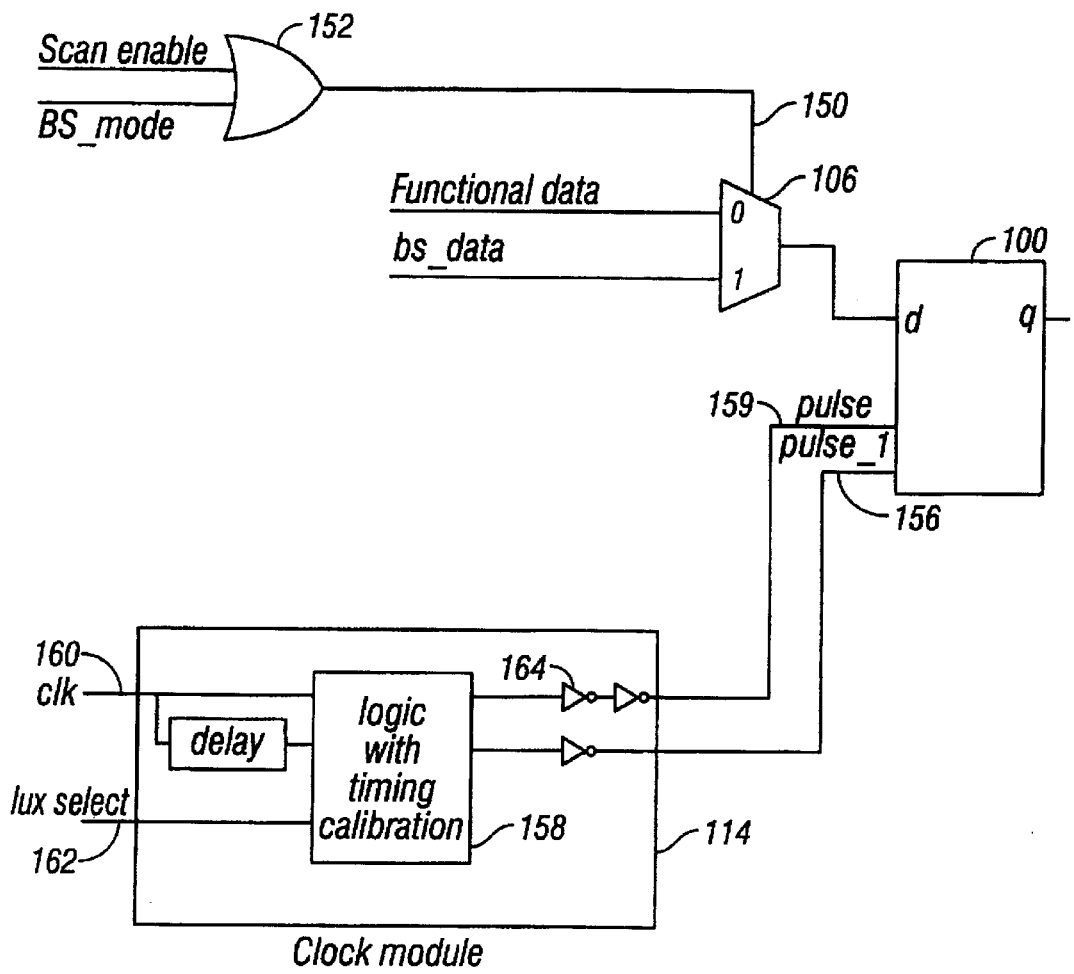
FIG. 4 is an expanded view of the functional flip-flop 100, multiplexor 106, and clock module 114 of FIG. 3.

FIG. 4 is an expanded view of the functional flip-flop 100, multiplexor 106, and clock module 114 of FIG. 3. The clock module 114 aids in the timing of switching between functional mode and boundary scan mode. An input line 150 to multiplexor 106 indicates if the cell is in boundary scan mode or functional mode, through the use of an or gate 152.

Functional flip-flop 100 accepts as input the output of the multiplexor 106 and a clock or pulse signal (both normal 154 and inverted 156) from clock module 114. The clock module 114 contains logic with timing calibration 158, which acts to create a continuous pulse when the cell is in boundary scan mode while allowing the pulse to act as a normal clock signal during functional mode. An input clock signal 160 may include a delay for aiding the logic with timing calibration 158 such that when a multiplexor select signal 162 is high, indicating the cell is in boundary scan mode, the logic with timing calibration 158 initiates the continuous pulse. Delays/inverters 164 may be contained in the clock module for design-specific application.

Figure 5:
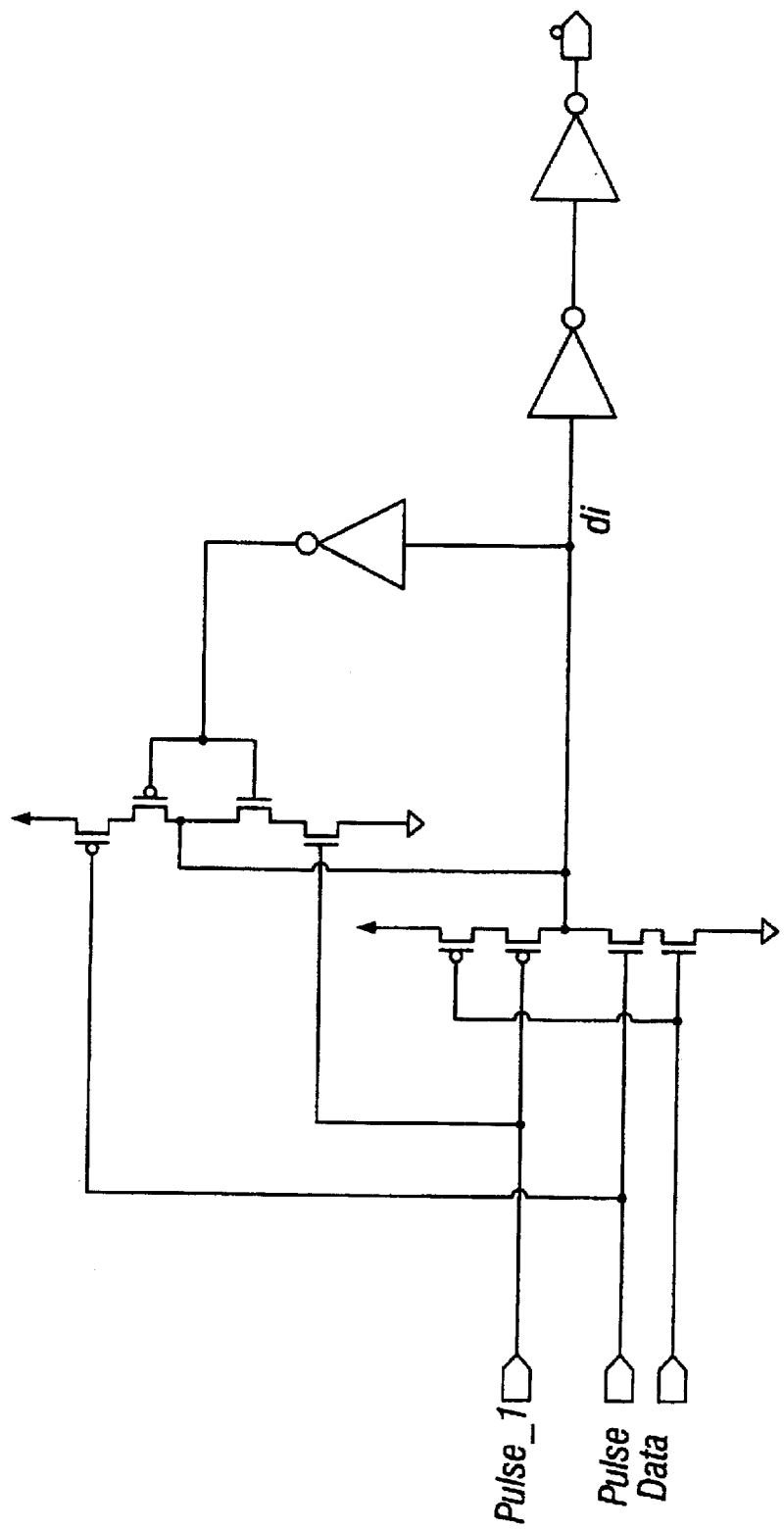
FIG. 5 is a schematic diagram illustrating an example of a functional flip-flop in accordance with a presently preferred embodiment of the present invention.

FIG. 5 is a schematic diagram illustrating an example of a functional flip-flop in accordance with a presently preferred embodiment of the present invention. The functional flip flop is designed to act as a flip-flop when the pulse signal is acting normally (i.e. cycling), but act as a buffer (i.e. be transparent) when the pulse signal is driven continuously high.

Figure 6:
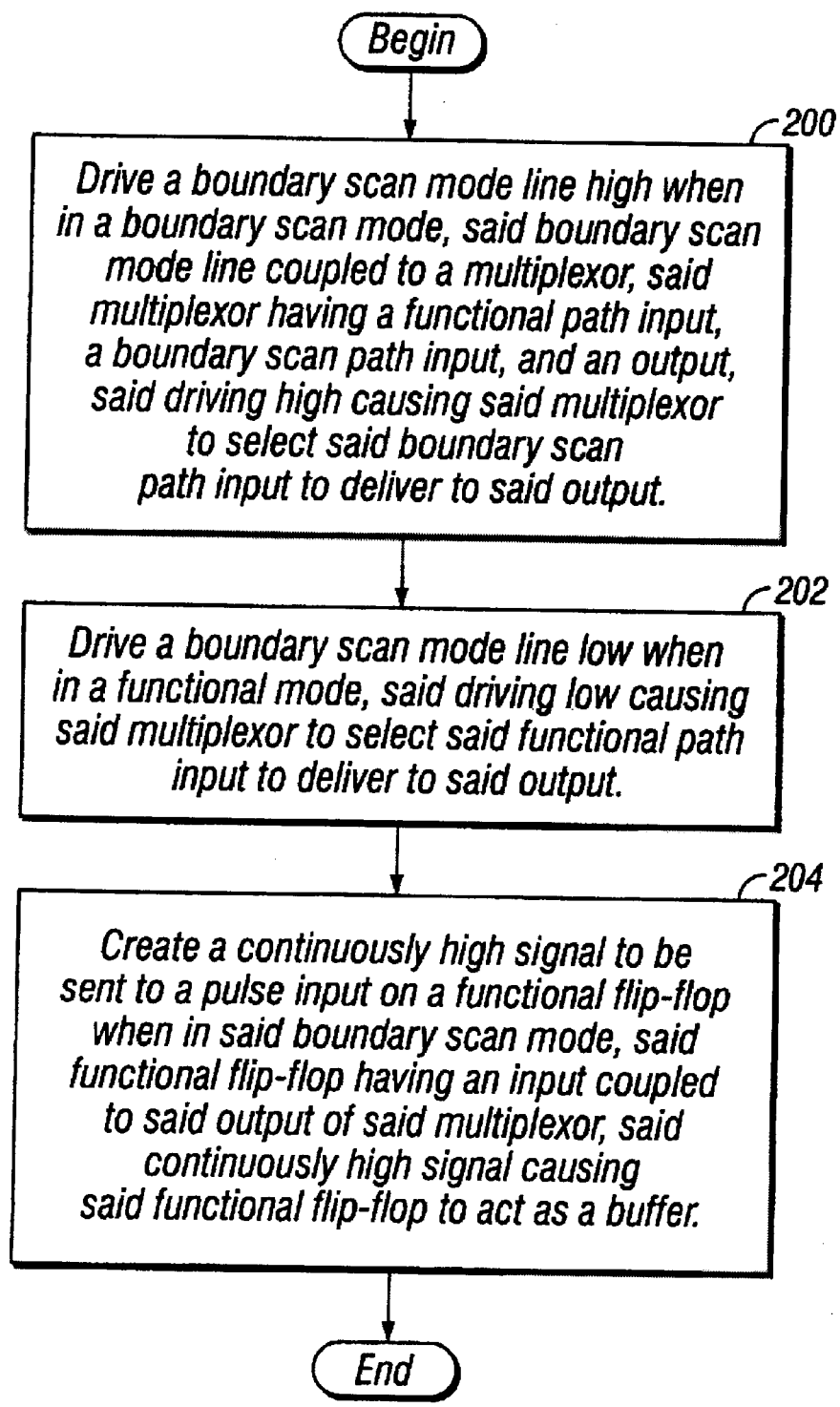
FIG. 6 is a flow diagram illustrating a method of operating a boundary scan cell in accordance with a presently preferred embodiment of the present invention.

FIG. 6 is a flow diagram illustrating a method of operating a boundary scan cell in accordance with a presently preferred embodiment of the present invention. At 200, a boundary scan mode line is driven high when in a boundary scan mode, said boundary scan mode line coupled to a multiplexor, said multiplexor having a functional path input, a boundary scan path input, and an output, said driving high causing said multiplexor to select said boundary scan path input to deliver to said output. At 202, a boundary scan mode line is driven low when in a functional mode, said driving low causing said multiplexor to select said functional path input to deliver to said output. At 204, a continuously high signal is created to be sent to a pulse input on a functional flip-flop when in said boundary scan mode, said functional flip-flop having an input coupled to said output of said multiplexor, said continuously high signal causing said functional flip-flop to act as a buffer.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A boundary scan cell comprising:

a functional flip-flop having a data input and a data output;

boundary scan circuitry having a data input and a data output, said boundary scan circuitry comprising a capture stage flip-flop and an update stage flip-flop, said capture stage flip-flop having a data input, a data output, a boundary scan input, a boundary scan output, and a clock input and said update stage flip-flop having a data input, a data output, and an update enable input; and a multiplexor having a first input, a second input, an output, and a boundary scan enable input, wherein
said first input of said multiplexor is coupled to a functional path,
said second input of said multiplexor is coupled to said data output of said boundary scan circuitry,
said output of said multiplexor is coupled to said data input of said functional flip-flop,
said data output of said capture stage flip-flop is coupled to said data input of said update stage flip-flop,
said data input of said capture stage flip-flop is coupled to said data input of said boundary scan circuitry, and
said data output of said update stage flip-flop is coupled to said data output of said boundary scan circuitry.

2. A boundary scan cell comprising:

a functional flip-flop having a data input, a pulse input, an inverse pulse input, and a data output;

boundary scan circuitry having a data input and a data output;

a multiplexor having a first input, a second input, a boundary scan enable input, and an output; and a boundary scan clock module having a clock input, a multiplexor select input, a pulse output, and an inverse pulse output, wherein:
said first input of said multiplexor is coupled to a functional path,
said second input of said multiplexor is coupled to said data output of said boundary scan circuitry,
said output of said multiplexor is coupled to said data input of said functional flip-flop,
said pulse output of said boundary scan clock module is coupled to said pulse input of said functional flip-flop,
said inverse pulse output of said boundary scan clock module is coupled to said inverse pulse input of said functional flip-flop, and said clock module comprises:

a delay having an input and an output, a logic with timing calibration circuit having a first input, a second input, a third input, a first output, and a second output, a first inverter having an input and an output, a second inverter having an input and an output, and a third inverter having an input and an output, wherein said clock input is coupled to said first input of said logic with timing calibration circuit and to said input of said delay, said output of said delay is coupled to said second input of said logic with timing calibration circuit, said multiplexor select input is coupled to said third input of said logic with timing calibration, said first output of said logic with timing calibration circuit is coupled to said input of said first inverter, said output of said first inverter is coupled to said input of said second inverter, said output of said second inverter is coupled to said pulse output, said second output of said logic with timing calibration circuit is coupled to said input of said third inverter, said output of said third inverter is coupled to said inverse pulse output.

3. A boundary scan cell comprising:

a multiplexor having a first input, a second input, a boundary scan enable input, and an output, wherein said first input is coupled to a functional path;

a functional flip-flop having a data input, a pulse input, an inverse pulse input, and a data output, wherein said data input of said functional flip-flop is coupled to said output of said multiplex or;

boundary scan circuitry having a data input and a data output, wherein said data output of said boundary scan circuitry is coupled to said second input of said multiplexor; and a boundary scan clock module having a clock input, a multiplexor select input, a pulse output, and an inverse pulse output, wherein said pulse output of said boundary scan clock module is coupled to said pulse input of said functional flip-flop, said inverse pulse output of said boundary scan clock module is coupled to said inverse pulse input of said functional flip-flop, and said boundary scan clock module comprises:

a logic with timing calibration circuit having a first input, a second input, a first output, and a second output, wherein said first input of said logic with timing calibration circuit is coupled to said clock input of said boundary scan clock module, said second input of said logic with timing calibration circuit is coupled to said multiplexor select input of said boundary scan clock module, and said first output of said logic with timing calibration circuit is coupled to said pulse output of said boundary scan clock module, and an inverter having an input and an output, wherein said input of said inverter is coupled to said second output of said logic with timing calibration circuit and said output of said inverter is coupled to said inverse pulse output of said boundary scan clock module.

* * * * *

UNITED STATES PATENT AND TRADEMARK OFFICE
CERTIFICATE OF CORRECTION

PATENT NO.    : 6,567,944 B1
DATED         : May 20, 2003
INVENTOR(S)   : Gajendra P. Singh et al.

It is certified that error appears in the above-identified patent and that said Letters Patent is hereby corrected as shown below:

<u>Column 5,</u>
Line 34, replace "multiplex or" with -- multiplexor --.

Signed and Sealed this

Sixteenth Day of September, 2003

JAMES E. ROGAN
*Director of the United States Patent and Trademark Office*